United States Patent
Verger et al.

(10) Patent No.: US 9,029,682 B2
(45) Date of Patent: May 12, 2015

(54) RADIATION-COLLECTING DEVICE

(75) Inventors: Arnaud Verger, Paris (FR); Samuel Solarski, La Madeleine (FR); Emmanuel Valentin, Le Plessis Trevise (FR); Didier Jousse, Taverny (FR)

(73) Assignees: Saint-Gobain Adfors, Chambery (FR); Saint-Gobain Glass France, Courbevoie (FR)

(*) Notice: Subject to any disclaimer, the term of this patent is extended or adjusted under 35 U.S.C. 154(b) by 550 days.

(21) Appl. No.: 13/520,671

(22) PCT Filed: Jan. 7, 2011

(86) PCT No.: PCT/FR2011/050030
§ 371 (c)(1),
(2), (4) Date: Sep. 21, 2012

(87) PCT Pub. No.: WO2011/083282
PCT Pub. Date: Jul. 14, 2011

(65) Prior Publication Data
US 2013/0008499 A1 Jan. 10, 2013

(30) Foreign Application Priority Data
Jan. 8, 2010 (FR) .................................. 10 50118

(51) Int. Cl.
| | |
|---|---|
| *H01L 31/054* | (2014.01) |
| *H01L 31/02* | (2006.01) |
| *H01L 31/0216* | (2014.01) |
| *G02B 5/02* | (2006.01) |
| *H01L 31/043* | (2014.01) |

(52) U.S. Cl.
CPC ........ *H01L 31/02168* (2013.01); *G02B 5/0236* (2013.01); *Y02E 10/50* (2013.01); *H01L 2924/0002* (2013.01); *H01L 31/043* (2014.12)

(58) Field of Classification Search
None
See application file for complete search history.

(56) References Cited

U.S. PATENT DOCUMENTS

| | | | |
|---|---|---|---|
| 5,656,098 A | 8/1997 | Ishikawa | |
| 6,257,772 B1 * | 7/2001 | Nakanishi et al. | ............... 385/89 |
| 2006/0182941 A1 * | 8/2006 | Yano et al. | ................. 428/292.1 |

FOREIGN PATENT DOCUMENTS

| | | |
|---|---|---|
| EP | 1724621 | 11/2006 |
| EP | 2043162 | 4/2009 |
| JP | 2008-91162 | 4/2008 |
| WO | WO 2008/146896 | 4/2008 |

OTHER PUBLICATIONS

International Search Report as issued for International Application No. PCT/FR2011/050030, dated Mar. 17, 2011.

* cited by examiner

*Primary Examiner* — Susan D Leong
(74) *Attorney, Agent, or Firm* — Pillsbury Winthrop Shaw Pittman LLP

(57) ABSTRACT

A radiation-collecting device includes at least one radiation-collecting element and a scattering layer placed, in relation to the element, on that side on which the radiation is incident on the device. The scattering layer has a transparent fibrous structure and a transparent medium for encapsulating the fibers of the fibrous structure, the absolute value of the difference between the refractive index of the fibers of the fibrous structure and the refractive index of the encapsulating medium being equal to or greater than 0.05.

17 Claims, 2 Drawing Sheets

RADIATION-COLLECTING DEVICE

CROSS-REFERENCE TO RELATED APPLICATIONS

This application is the U.S. National Stage of PCT/FR2011/050030, filed Jan. 7, 2011, which in turn claims priority to French Application No. 1050118, filed Jan. 8, 2010. The content of these applications are incorporated herein by reference in their entirety.

The present invention relates to a radiation-collecting device, such as a photovoltaic module. The present invention also relates to a cover for a radiation-collecting element, especially for a photovoltaic cell.

As is known, a photovoltaic module comprises, as radiation-collecting element, at least one photovoltaic cell capable of converting radiation energy into electrical energy. A photovoltaic cell conventionally comprises a material capable of energy conversion and two electrically conductive contacts, or electrodes, on either side of this material.

The front electrode of a photovoltaic cell, intended to be placed on the side on which radiation is incident on the cell, may especially be formed based on a transparent conductive oxide (or TCO) layer or based on a transparent metallic coating (transparent conductive coating or TCC). Conventionally, this front electrode is combined with a front substrate of the photovoltaic module, or substrate having a glazing function, which ensures that the photovoltaic cells are mechanically protected while still allowing good radiation transmission to the cells.

The energy conversion efficiency of a photovoltaic module is directly influenced by the amount of radiation that reaches the energy conversion material of each photovoltaic cell. It is therefore necessary, to improve this efficiency, to maximize the amount of incident radiation on the module that reaches the energy conversion material. To do this, a first known strategy consists in improving the transmission properties of the front substrate, by texturing at least its front face, the one intended to be placed on the side on which the radiation is incident on the photovoltaic module, so as to limit reflection of the incident radiation on the module at the air/front substrate interface. Another known strategy consists, when the module comprises photovoltaic cells in which the front electrode is formed based on a TCO layer, in providing this TCO layer with microtexturing on its face on the opposite side from the front substrate. Thanks to this microtexturing, the TCO layer traps the incident radiation, thereby increasing the probability of the radiation being absorbed by the energy conversion material of the cell. However, the efficiency of photovoltaic modules incorporating such textured front substrates or such microtextured TCO layers remains limited.

It is these drawbacks that the invention is more particularly intended to remedy by providing a radiation-collecting device, especially a photovoltaic module, which has a better energy conversion efficiency than the devices of the prior art.

For this purpose, one subject of the invention is a radiation-collecting device comprising at least one radiation-collecting element, characterized in that it further comprises a scattering layer placed, in relation to the collecting element, on that side on which the radiation is incident on the device, the scattering layer having a transparent fibrous structure and a transparent medium for encapsulating the fibers of the fibrous structure, the absolute value of the difference between the refractive index of the fibers of the fibrous structure and the refractive index of the encapsulating medium being equal to or greater than 0.05.

Throughout this application, the numerical values of the refractive indices are those measured at 550 nm.

In the context of the invention, the term "transparent" refers to transparency at least in the wavelength ranges of use for the radiation-collecting elements of the device. To give an example, in the case of a photovoltaic module comprising photovoltaic cells based on polycrystalline silicon, each transparent structure or medium is advantageously transparent in the wavelength range between 400 nm and 1200 nm, these being the wavelengths of use for this type of cell.

It should also be understood by the expression "encapsulating the fibers of the fibrous structure" that at least some of the fibers of the fibrous structure are coated. Thus, in the scattering layer there are interfaces between the material of the fibers and the material of the encapsulating medium.

The scattering layer is positioned, relative to the collecting element, on the side on which the radiation is incident on the device, i.e. at the front of the collecting element. Conventionally, in the context of the invention, the rear-front direction in a radiation-collecting device is opposite that of the direction of propagation of radiation intended to be collected by the device.

For a photovoltaic module according to the invention, the radiation-collecting element is a photovoltaic cell and the scattering layer is positioned at the front of this cell. Thanks to the relatively large difference between the refractive index of the fibers of the fibrous structure and the refractive index of the encapsulating medium, the scattering layer is capable of improving the way the radiation is guided to the energy conversion material of the photovoltaic cell, on the one hand by a radiation trapping effect, which increases the probability of absorption of the radiation by the energy conversion material of the cell, and, on the other hand, by an angle haze effect, which increases the transmission at large angles of incidence of the radiation.

It is thus possible, for a photovoltaic module according to the invention and compared with a module of the prior art not having the scattering layer defined in the invention, either to increase the energy conversion efficiency of the module for the same thickness of the energy conversion material, or to maintain the same energy conversion efficiency while reducing the thickness of the energy conversion material, that is to say reducing the cost of the module.

According to one advantageous feature of the invention, the medium for encapsulating the fibers of the fibrous structure is a polymeric material. In particular, the encapsulating medium may be formed by a polymeric lamination interlayer, for example based on polyvinylbutyral (PVB), ethylene vinyl acetate (EVA), polyurethane, an ionomer, or an adhesive based on polyolefin. As a variant, the encapsulating medium may be formed by a front substrate made of thermoplastic polymer of the collecting device. Examples of appropriate transparent thermoplastic polymers comprise, in particular, polyethylene terephthalate (PET), polyethylene naphthalate (PEN), polycarbonate, polyurethane, polymethyl methacrylate, polyamides, polyimides, fluoropolymers such as ethylene tetrafluoroethylene (ETFE) and polytetrafluoroethylene (PTFE).

The fibers of the fibrous structure, whether having a woven or nonwoven structure, play a role in mechanically reinforcing the encapsulating medium. In particular, when the encapsulating medium is a lamination interlayer or a front substrate of the collecting device, the rigidity of this interlayer or substrate is increased as a result. A photovoltaic module according to the invention thus has improved mechanical properties, especially in terms of admissible load, enabling it to pass stringent mechanical tests, for example those provided by the IEC standards for checking the resistance of the module to wind or snow loadings. When the encapsulating medium is a lamination interlayer of the module, intended to be surmounted at the front by a glass substrate, the increased rigidity of the interlayer resulting from the mechanical reinforcement by the fibrous structure enables thinner glasses to be used at the front of the interlayer, and therefore a reduction in the thickness and the weight of the module.

According to one advantageous feature of the invention, the fibrous structure comprises glass fibers and/or polymer fibers. In the case of glass fibers, the glass constituting the fibers may be of any fiberizable glass type, especially E-glass. In the case of polymer fibers, these may in particular be polyester fibers or fibers of a polyolefin such as polyethylene or polypropylene. Advantageously, the fibrous structure has a mass per unit area of between 10 and 500 $g/m^2$, preferably between 10 and 100 $g/m^2$, and comprises fibers having a diameter between 1 and 20 micrometers, preferably between 5 and 15 micrometers. Preferably, the fibrous structure has a thickness of between 10 micrometers and 1 millimeter.

In practice, the haze and light transmission properties of the scattering layer may be adjusted by varying one or more parameters from among, in particular, the mass per unit area of the fibrous structure, the diameter of the fibers of the fibrous structure, the composition of the fibers of the fibrous structure, the composition of the encapsulating medium. In accordance with the invention, the composition of the fibers of the fibrous structure and the composition of the encapsulating medium are adapted in such a way that the absolute value of the difference between the refractive index of the fibers of the fibrous structure and the refractive index of the encapsulating medium is equal to or greater than 0.05. According to one advantageous feature of the invention, the scattering layer has a total light transmission equal to or greater than 80% and a haze value equal to or greater than 40%. In this application, the total light transmission of an element, which comprises the direct light transmission and the diffuse light transmission, is determined according to the ISO 9050:2003 standard. In addition, the haze value of an element, expressed as a percentage, is understood to mean a quantity representative of the capability of this element to deflect radiation. In this application, the haze values are measured using a haze meter according to the ASTM D 1003 standard.

The fibrous structure may be a nonwoven structure or a woven structure. For a nonwoven structure, the fibers are generally mingled, whereas for a woven structure the fibers are aligned in the warp and weft directions. In both these cases, the fibrous structure plays a role in providing mechanical reinforcement to the encapsulating medium. When the fibrous structure is woven, the mechanical reinforcement is particularly substantial in the warp and the weft directions. In one advantageous embodiment, the fibrous structure is a veil, ensuring a random distribution of the fibers in the scattering layer. Conventionally, the term "veil" is understood to mean a nonwoven formed from completely dispersed filaments. With such a veil, the properties of the scattering layer, especially in terms of haze and light transmission, are thus substantially uniform.

A nonwoven veil of glass fibers generally contains a binder, which binds the fibers and gives the veil sufficient rigidity for it to be able to be easily handled. This binder, which conventionally comprises at least one polymer capable of binding the fibers, is chosen to be transparent and may be of any appropriate type known to those skilled in the art. The presence of a binder in the veil may be advantageous in the industrial manufacture of the radiation-collecting device according to the invention, by facilitating the handling of the veil. However, the binder must cover only a limited surface of the glass fibers of the veil so that radiation passing through the scattering layer effectively encounters interfaces between the fibers and the encapsulating medium. For correct implementation of the invention, the binder preferably represents about 5 to 30%, more preferably 5 to 20%, by weight of the glass fiber veil.

According to one advantageous feature of the invention, the scattering layer is placed against a front electrode of the radiation-collecting element. The radiation-collecting element of the device may be a photovoltaic cell.

In one advantageous embodiment of a radiation-collecting device according to the invention, the device comprises a first photovoltaic cell, the absorber material of which has a first absorption spectrum, and a second photovoltaic cell, the absorber material of which has a second absorption spectrum at least partially separate with respect to the first absorption spectrum, the scattering layer being inserted between the first photovoltaic cell and the second photovoltaic cell.

Another subject of the invention is also a cover for a radiation-collecting element, especially for a photovoltaic cell, this cover comprising a transparent substrate and a scattering layer, in which the scattering layer has a transparent fibrous structure and a transparent medium for encapsulating the fibers of the fibrous structure, the absolute value of the difference between the refractive index of the fibers of the fibrous structure and the refractive index of the encapsulating medium being equal to or greater than 0.05.

The scattering layer of the cover may be placed against one face of the substrate. As a variant, when the substrate is made of a thermoplastic polymer, the scattering layer of the cover may be incorporated into the substrate, with at least part of the substrate that forms the medium for encapsulating the fibers of the fibrous structure.

The features and advantages of the invention will become apparent in the following description of three embodiments of a radiation-collecting device according to the invention, given solely by way of example and with reference to the appended drawings in which.

Figure 1:
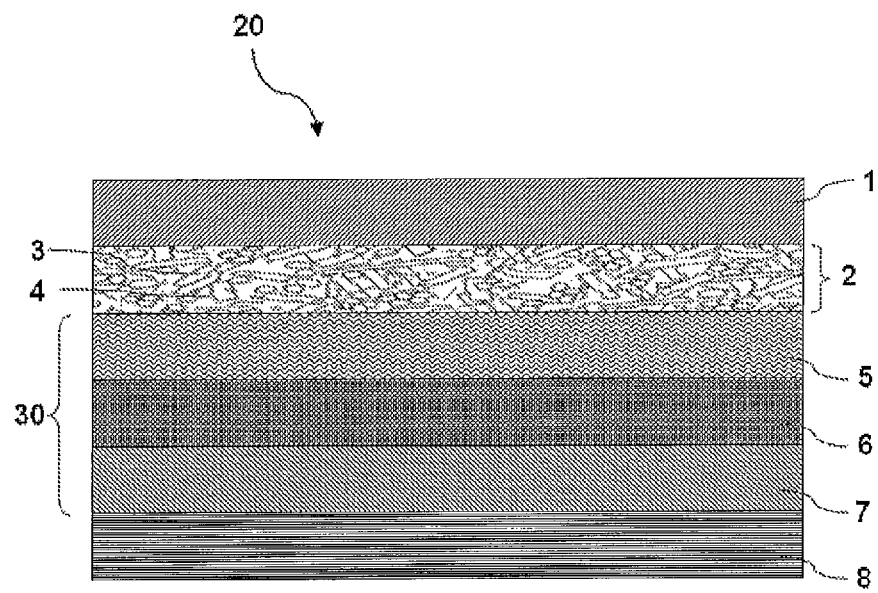
FIG. 1 is a schematic cross-sectional view of a photovoltaic solar module according to a first embodiment of the invention.

The photovoltaic solar module 20 shown in FIG. 1 comprises a photovoltaic cell 30 consisting of polycrystalline silicon wafers forming a p-n junction. As may be seen in FIG. 1, the module 20 comprises a front substrate 1 having a glazing function and a rear substrate 8 having a support function. The front substrate 1, intended to be placed on the side on which the solar radiation is incident on the module 20, may especially be made of an extra-clear transparent glass having a very low content of iron oxides, or made of a transparent thermoplastic polymer.

The rear substrate 8 is made of any appropriate material, whether transparent or not, and bears, on its face directed toward the interior of the module 20, that is to say on the side on which the solar radiation is incident on the module, an electrically conductive layer 7 that forms a rear electrode of the photovoltaic cell 30. To give an example, the layer 7 is a metal layer, especially made of silver or aluminum.

The layer 7 forming the rear electrode is surmounted, as is conventional, by a polycrystalline silicon wafer 6 capable of converting solar energy to electrical energy. The wafer 6 is itself surmounted by an electrically conductive transparent layer 5 which forms a front electrode of the cell 30. The photovoltaic cell 30 is thus formed by the stack of the layers 5, 6 and 7. In this example, the layer 5 forming the front electrode of the cell 30 is a layer based on aluminum-doped zinc oxide (AZO). As a variant, the layer 5 may be a layer based on another doped transparent conductive oxide (TCO), or a transparent metallic coating (TCC) such as a silver-based stack.

A scattering layer 2 is positioned between the layer 5 forming the front electrode and the front substrate 1. This scattering layer 2 comprises a transparent veil 3 of E-glass fibers, the refractive index $n_3$ of which is around 1.57, and a transparent matrix 4 made of PVB, the refractive index $n_4$ of which is around 1.48, which matrix encapsulates the veil 3. Thus, the difference in refractive index between the fibers of the veil 3 and the matrix 4 is around 0.09. An example of a glass fiber veil that can be used for the veil 3 is a veil of the U50 type sold by Saint-Gobain Technical Fabrics, having a grammage, or mass per unit area, of 50 g/m$^2$.

As shown schematically in FIG. 1, the polymer matrix 4 encapsulates the veil 3, having substantially the same thickness as the veil. However, the polymer matrix 4 may have a greater thickness than the thickness of the veil 3, the veil 3 then being encapsulated in only a portion of the polymer matrix 4. The veil 3 mechanical reinforces the PVB matrix 4 so that the scattering layer 2 has a greater rigidity than a layer made only of PVB and having the same thickness as the scattering layer 2.

By virtue of the relatively large difference in refractive index between the fibers of the veil 3 and the encapsulating matrix 4, the radiation is strongly scattered at the interface between the fibers of the veil and the matrix, resulting in a high haze value of the scattering layer 2. The scattering layer 2 thus has both a high haze value, greater than 40%, and also a high total light transmission, greater than 80%. In practice, the haze and light transmission properties of the scattering layer 2 may be adjusted by varying one or more parameters from among, especially, the mass per unit area of the veil 3, the diameter of the fibers of the veil 3, the composition of the fibers of the veil 3, the composition of the polymer matrix 4, so as to obtain a scattering layer 2 that provides an advantageous compromise between haze and light transmission.

The high haze of the scattering layer 2 placed in front of the photovoltaic cell 30 promotes absorption of a high percentage of the radiation incident on the module by the energy conversion material 6, according to two main effects.

The first effect is a radiation trapping effect, or light trapping effect, because of the scattering layer 2. Specifically, because of the strong scattering at the interface between the fibers of the veil 3 and the matrix 4, the optical path of the radiation in the layer 2 and the underlying layers 5, 6 is lengthened, thereby increasing the probability of absorption of the radiation by the photovoltaic semiconductor material of the wafer 6 positioned at the rear of the layer 2. The scattering layer 2 thus functions to a certain extent as a guide, which maintains and directs the radiation within the module 20 until it is absorbed by the energy conversion material 6.

The second effect, or "angle haze" effect, corresponds to a reduction in reflection, for large angles of incidence of the radiation, at the interface between the scattering layer 2 and the underlying layer of the module, which is the front electrode 5 in this first embodiment. Due to scattering at the interface between the fibers of the veil 3 and the matrix 4, the rays having high angles of incidence on the module 20 are "straightened up" within the scattering layer 2 so that they encounter the underlying layer 5 of the module at lower angles of incidence. Since the range of high angles of incidence, close to 90°, promotes reflection at the interface between the scattering layer 2 and the underlying layer 5, the straightening-up of the rays by scattering in the layer 2 is accompanied by an appreciable reduction in reflection. Thus, a wider range of angles of incidence of the radiation is transmitted to the energy conversion material 6, thereby increasing the amount of incident radiation on the module 20 that is absorbed by the energy conversion material 6.

These two effects, combined with the high total light transmission of the scattering layer, serve to increase the energy conversion efficiency of the photovoltaic module 20 relative to a similar photovoltaic module of the prior art not containing a scattering layer.

Figure 2:
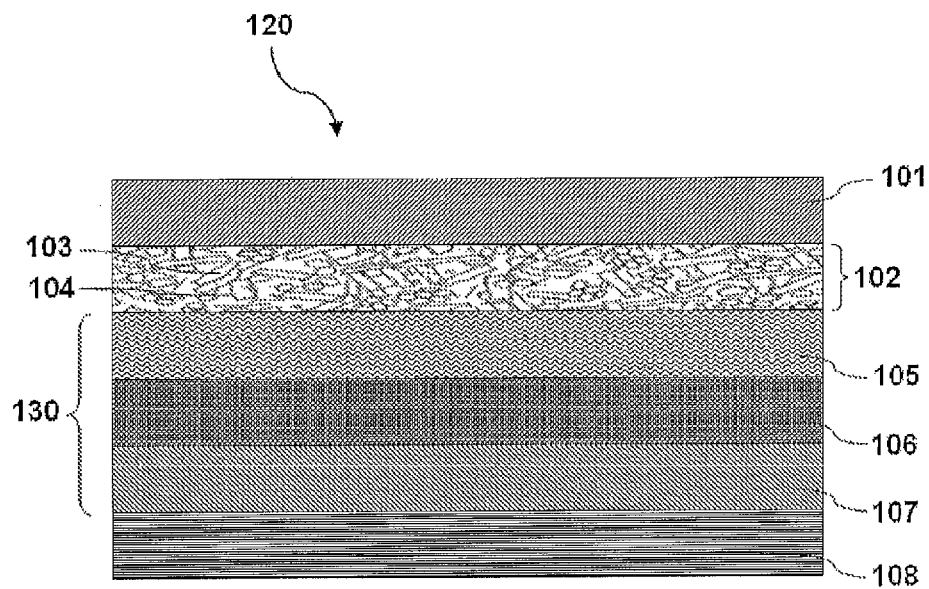
FIG. 2 is a cross-sectional view similar to FIG. 1 for a photovoltaic solar module according to a second embodiment of the invention.

In the second embodiment shown in FIG. 2, the elements analogous to those of the first embodiment bear the same references, but increased by 100. The photovoltaic solar module 120 of this second embodiment differs from the module 20 above in that it comprises, instead of cells comprising polycrystalline silicon wafers, a thin-film photovoltaic cell 130, the absorber layer of which is based on a chalcopyrite compound comprising copper, indium and selenium, called a CIS absorber layer. Optionally, gallium may be added to such a CIS absorber layer, to give a CIGS absorber layer, or else aluminum or sulfur may be added thereto.

The module 120 according to the second embodiment comprises a front substrate 101 having a glazing function and a rear substrate 108 having a support function. The rear substrate 108 bears, on its face directed toward the interior of the module 120, an electrically conductive layer 107 forming a rear electrode of the photovoltaic cell 130 of the module. To give an example, the layer 107 is based on molybdenum. When the rear substrate 108 is made of glass and the rear electrode 107 is made of molybdenum, a layer (not shown), especially based on silicon nitride $Si_3N_4$, is advantageously placed between the rear substrate 108 and the layer 107 in order to form an alkali barrier.

The layer 107 is surmounted by a layer 106 of absorber material based on a chalcopyrite compound, especially CIS or GIGS, capable of converting solar energy into electrical energy. The absorber layer 106 is itself surmounted by a layer of cadmium sulfide CdS (not shown), optionally combined with a layer of undoped intrinsic zinc oxide ZnO (also not shown), and then by an electrically conductive transparent layer 105 that forms a front electrode of the cell 130. The photovoltaic cell 130 of the module 120 is thus formed by the stack of the layers 105, 106 and 107. In this example, the layer 105 forming the front electrode of the cell 130 is a layer based on aluminum-doped zinc oxide (AZO). As a variant, the layer 5 may be a layer based on another doped transparent conductive oxide (TCO), or a transparent metallic coating (TCC) such as a silver-based stack.

Similarly to the first embodiment, a scattering layer 102 is positioned between the layer 105 forming the front electrode and the front substrate 101. The scattering layer 102 comprises a transparent veil 103 made of E-glass fibers and an encapsulating matrix 104 made of PVB, in the same way as the scattering layer 2 of the first embodiment. The use of a PVB encapsulating matrix, or one made of any other polymeric lamination interlayer, is advantageous for holding the functional layers of the module 120 in place between the front substrate 101 and the rear substrate 108.

As previously, by virtue of the high haze of the scattering layer 102 placed in front of the photovoltaic cell 130, the energy conversion efficiency of the module 120 is increased relative to the efficiency of a similar module not containing a scattering layer, according to the aforementioned two effects, namely radiation trapping and angle haze.

Figure 3:
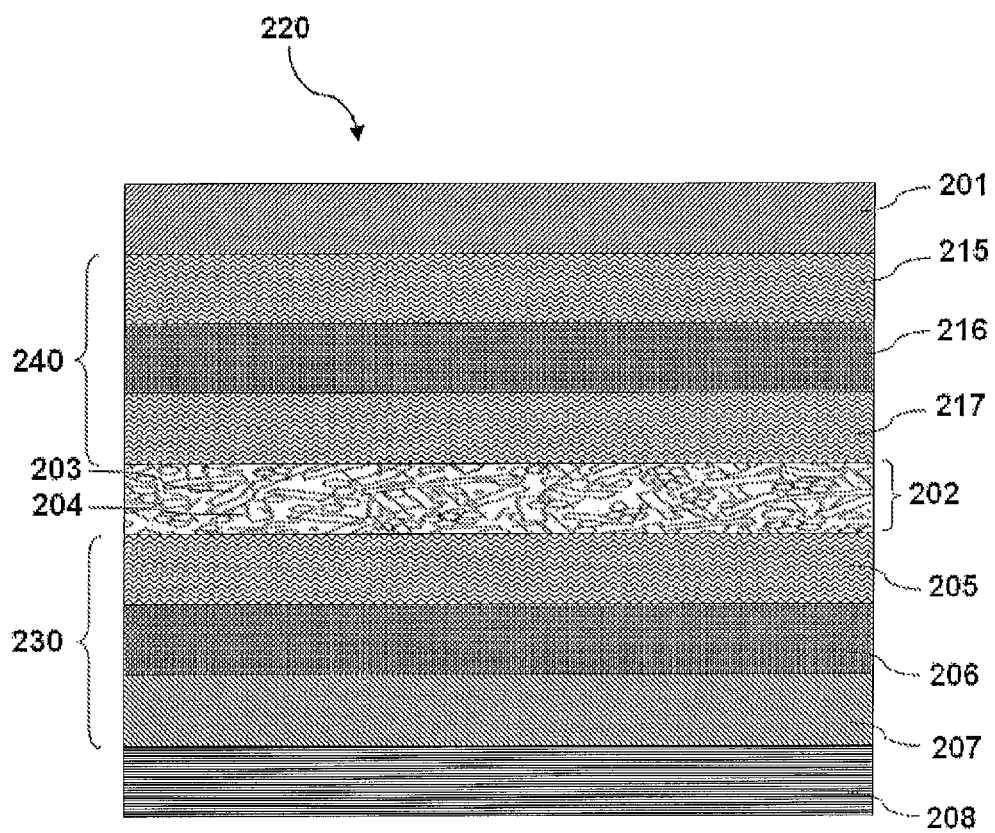
FIG. 3 is a cross-sectional view similar to FIG. 1 for a photovoltaic solar module according to a third embodiment of the invention.

In the third embodiment shown in FIG. 3, the elements analogous to those of the first embodiment bear identical references but increased by 200. The photovoltaic solar module 220 of this third embodiment differs from the modules described previously in that it comprises a "four-wire tandem cell" formed by the superposition of two photovoltaic cells 230 and 240.

As may be seen in FIG. 3, the module 220 comprises a front substrate 201 having a glazing function and a rear substrate 208 having a support function, between which the stack of functional layers of the module is placed. The cell 240 placed at the front of the module 220 is a thin-film cell, the absorber layer 216 of which is based on amorphous silicon, which absorbs the high-energy photons of the solar spectrum, in the wavelength range between about 300 nm and 600 nm. The cell 230 placed at the rear of the module 220 is a thin-film cell, the absorber layer 206 of which is a CIGS absorber layer, which absorbs in the wavelength range between about 500 nm and 1000 nm. Since the absorption spectra of the front cell 240 and of the rear cell 230 are at least partly separate, that portion of the spectrum not used for energy conversion by the front cell 240 may be used by the rear cell 230. The tandem cell thus makes it possible to optimize the use of the solar radiation by the module 220.

At the front of the module 220, the front substrate 201 covers the front cell 240 which comprises, in succession starting from the front substrate 201, an electrically conductive transparent layer 215 forming a front electrode of the cell 240, the absorber layer 216 based on amorphous silicon, and another electrically conductive transparent layer 217 forming a rear electrode of the cell 240. To give an example, each of the layers 215 and 217 forming the electrodes of the front cell 240 is a layer based on aluminum-doped zinc oxide (AZO). As a variant, each layer 215 or 217 may be a layer based on another doped transparent conductive oxide (TCO), or a transparent metallic coating (TCC) such as a silver-based stack.

To the rear of the module 220, the rear substrate 208 bears the rear cell 230, which comprises, in succession starting from the rear substrate 208, an electrically conductive layer 207 forming a rear electrode of the cell 230, the CIGS absorber layer 206 with a thickness of between about 500 nm and 4000 nm, a layer of cadmium sulfide CdS (not shown), optionally combined with a layer of undoped intrinsic zinc oxide ZnO (also not shown), and a transparent electrically conductive layer 205 that forms a front electrode of the cell 230. To give an example, the layer 207 forming the rear electrode is based on molybdenum and the layer 205 forming the front electrode is a layer based on aluminum-doped zinc oxide (AZO). As a variant, the layer 205 may be a layer based on another doped transparent conductive oxide (TCO), or a transparent metallic coating (TCC) such as a silver-based stack.

In this embodiment, in accordance with the invention, a scattering layer 202 is positioned at the front of the rear cell 230, between the layer 205 forming the front electrode of the rear cell 230 and the layer 217 forming the rear electrode of the front cell 240. The scattering layer 202 comprises a veil 203 of E-glass fibers and an encapsulating matrix 204 made of PVB, in the same way as the scattering layer 2 of the first embodiment.

As previously, through the two effects of radiation trapping and angle haze, the scattering layer 202 placed at the front of the rear cell 230 improves the guiding of the radiation incident on the module 220 to the absorber layer 206 of the rear cell. The scattering layer 202 thus increases the amount of radiation incident on the module 220 that is absorbed by the absorber layer 206 and therefore the energy conversion efficiency of the module 220.

The positioning of the scattering layer 202 between the two cells making up the four-wire tandem cell is all the more critical for increasing the energy conversion efficiency of the module 220 since the amount of incident radiation that can reach this central region of the module is limited because of radiation losses in the front portion of the module. Under these conditions, it is crucial for that part of the radiation that has arrived in the central region of the module to be optimally guided to the absorber layer 206 of the rear cell 230, so as to make the optimization of the use of solar radiation by the module 220 effective.

A variant (not shown) of the four-wire tandem cell according to the invention differs from the module 220 described above only in that the rear cell 230 based on a chalcopyrite compound is replaced with a cell based on microcrystalline silicon, which absorbs in the near infrared zone, in the wavelength range between about 600 nm and 1000 nm. Such a cell based on microcrystalline silicon comprises, in succession starting from the rear substrate of the module, an electrically conductive layer forming a rear electrode, an absorber layer based on microcrystalline silicon and an electrically conductive transparent layer forming a front electrode. To give an example, the layer forming the rear electrode is a metallic layer, especially a silver or aluminum layer, and the layer forming the front electrode is a layer based on a doped transparent conductive oxide (TCO) or a transparent metallic coating (TCC).

As previously, the absorption spectra of the front cell based on amorphous silicon and of the rear cell based on microcrystalline silicon are separate and that portion of the spectrum not used for energy conversion by the front cell may be used by the rear cell. As in the use of the module 220, the scattering layer inserted between the front and rear cells is critical for obtaining optimum use of the solar radiation by the tandem module and for guaranteeing improved energy conversion efficiency of the module compared with a similar module of the prior art containing no scattering layer.

The invention is not only directed to a radiation-collecting device incorporating a scattering layer as described above, positioned at the front of at least one collecting element of the device, but also to a cover for a radiation-collecting element comprising a substrate and a scattering layer as described above. By virtue of the fibrous structure that acts as a mechanical reinforcement in the scattering layer, a cover according to the invention has greater rigidity than a substrate of the prior art containing no fibrous structure.

The above examples illustrate the advantages of a device and a cover according to the invention comprising a composite scattering layer having both a high haze and a high light transmission, intended to be placed at the front of at least one radiation-collecting element. As explained above, the high haze of the scattering layer placed at the front of a radiation-collecting element promotes absorption of a large amount of the radiation incident on the device by this element, thereby increasing the energy conversion efficiency of the device incorporating this element.

The invention thus makes it possible for a device according to the invention or incorporating a cover according to the invention, compared with a similar device of the prior art containing no scattering layer, either to increase the energy conversion efficiency of the device for the same thickness of energy conversion material, or to reduce the thickness of the energy conversion material, and therefore the cost of the device, for the same energy conversion efficiency.

A process for manufacturing a photovoltaic module 20, 120 or 220 according to the invention, comprising a scattering layer as described above, which comprises a veil of E-glass fibers and a PVB encapsulating matrix, involves the formation of the veil forming part of the scattering layer, followed by the formation of the scattering layer and its insertion into the structure of the module.

The glass fiber veil may be formed using a "dry" process or using a "wet" process. Since such processes for manufacturing glass fiber veils are well known to those skilled in the art, they are not described here in greater detail. Once prepared, the veil is embedded in a PVB layer, by compressing the veil against the PVB layer. The assembly comprising the PVB layer and the veil embedded in the PVB layer is then placed in the laminated structure of the module, in the same way as for a conventional lamination interlayer, and this laminated structure is heated in an oven so as to provide good cohesion between the various constituent layers of the module.

As is known, a photovoltaic module according to the invention may be manufactured in superstrate mode, that is to say by successive deposition of the constituent layers of the device starting from the front substrate, this being especially the case for thin-film photovoltaic modules, the absorber of which is based on silicon or cadmium telluride, or in substrate mode, that is to say by successive deposition of the constituent layers of the cell on the rear substrate, which is especially the case for thin-film photovoltaic modules, the absorber of which is based on a chalcopyrite compound.

Particularly advantageously, when the module is manufactured in substrate mode and the polymer matrix of the scattering layer is a polymeric lamination interlayer, the scattering layer makes it possible both to improve the guiding of the radiation in the module and to ensure mechanical cohesion of the module.

When the encapsulating medium is formed by a transparent thermoplastic polymer, and especially by a portion of the front substrate having a glazing function of the module according to the invention, the fibers of the fibrous structure may be encapsulated in the thermoplastic substrate during molding, by positioning the fibrous structure in a mold and then injecting the thermoplastic polymer into the mold.

Whatever the technique chosen to place the fibrous structure in the encapsulating medium, for example by embedding it or by injection molding as described above, the use of a fibrous structure, whether woven or nonwoven, the fibers of which are bonded together prior to incorporation of the fibrous structure in the encapsulating medium, by entanglement and/or using a binder, makes handling and manufacturing easier.

The invention is not limited to the examples described and illustrated. The aforementioned advantages in terms of radiation trapping by the scattering layer and angle haze may be obtained by means of any layer having a transparent fibrous structure and a transparent encapsulating medium, which has suitable properties for exhibiting both high haze and high light transmission. One condition for obtaining a high haze is, in accordance with the invention, for the absolute value of the difference between the refractive index of the fibers of the fibrous structure and the refractive index of the encapsulating medium to be equal to or greater than 0.05.

When the encapsulating medium is a polymer matrix, especially formed by a lamination interlayer or a thermoplastic substrate, this polymer matrix may have a thickness equal to or greater than the thickness of the fibrous structure. In particular, when the polymer matrix has a thickness greater than that of the fibrous structure, this matrix may extend beyond one side or both sides of the fibrous structure.

As mentioned previously, the fibrous structure may be a woven or nonwoven structure. The fibrous structure may be formed by fibers not bonded together prior to the formation of the scattering layer, for example fibers that are deposited, or sprinkled, into a polymer matrix forming the encapsulating medium, while being mingled in the manner of a veil, this veil then not containing a binder other than the polymer matrix. According to a variant, the encapsulating medium may be formed by air or by a liquid of appropriate refractive index, instead of a polymer matrix.

Moreover, the invention has been described on the basis of examples in which the scattering layer is placed against the front electrode of a photovoltaic cell. As a variant, the scattering layer may be placed at the front of a photovoltaic cell while being separated from the front electrode of this cell by transparent intermediate layers.

As illustrated in the third embodiment, a device according to the invention may comprise several radiation-collecting elements. In this case, the device may integrate several scattering layers having a transparent fibrous structure and a transparent encapsulating medium, each being placed at the front of a collecting element of the device.

In particular, in the third embodiment, the photovoltaic module 220 may comprise, apart from the scattering layer 202 placed between the rear cell 230 and the front cell 240, a second scattering layer positioned at the front of the front cell 240 between the front electrode 215 and the front substrate 201. Such a configuration having two scattering layers improves the guiding of the radiation both to the absorber layer 216 of the front cell and to the absorber layer 206 of the rear cell, enabling the energy conversion efficiency of the module to be further increased.

Again with a view to increasing the energy conversion efficiency, a radiation-collecting device according to the invention may also incorporate, in addition to one or more scattering layers, other known means for improving the radiation guiding, especially a textured front substrate, so as to limit reflection of the radiation at the interface between the air and the front substrate.

Finally, the invention may be implemented for any type of device comprising a radiation-collecting element, without being limited to the devices described above. In particular, the invention may apply to photovoltaic modules comprising thin-film photovoltaic cells, the absorber layer of which is based on silicon, whether amorphous or microcrystalline silicon, based on a chalcopyrite compound, especially of the CIS or CIGS type, or else based on cadmium telluride. The invention may also apply to photovoltaic modules, the photovoltaic cells of which are formed from polycrystalline or monocrystalline silicon wafers forming a p-n junction, or to modules having organic photovoltaic cells. The invention is also applicable to radiation-collecting devices involving collecting elements other than photovoltaic cells, for example to thermal solar modules.

The invention claimed is:

1. A radiation-collecting device comprising:
   a radiation-collecting element; and
   a scattering layer placed, in relation to the radiation-collecting element, on a side on which radiation is incident on the device, the scattering layer having a transparent fibrous structure and a transparent medium constructed and arranged to encapsulate fibers of the fibrous structure, an absolute value of a difference between a refractive index of the fibers of the fibrous structure and a refractive index of the encapsulating medium being equal to or greater than 0.05.

2. The device as claimed in claim 1, wherein the encapsulating medium is a polymeric material.

3. The device as claimed in claim 2, wherein the encapsulating medium is formed by a polymeric lamination interlayer.

4. The device as claimed in claim 2, wherein the encapsulating medium is formed by a front substrate of the device.

5. The device as claimed in claim 1, wherein the fibrous structure comprises glass fibers.

6. The device as claimed in claim 1, wherein the fibrous structure comprises polymer fibers.

7. The device as claimed in claim 1, wherein the fibrous structure has a mass per unit area of between 10 and 500 g/m2.

8. The device as claimed in claim 1, wherein the fibrous structure comprises fibers having a diameter between 1 and 20 micrometers.

9. The device as claimed in claim 1, wherein the scattering layer has a total light transmission equal to or greater than 80% and a haze value equal to or greater than 40%.

10. The device as claimed in claim 1, wherein the fibrous structure is a nonwoven veil.

11. The device as claimed in claim 1, wherein the scattering layer is placed against a front electrode of the radiation-collecting element.

12. The device as claimed in claim 1, wherein the radiation-collecting element of the device is a photovoltaic cell.

13. The device as claimed in claim 1, comprising a first photovoltaic cell, an absorber material of which has a first absorption spectrum, and a second photovoltaic cell, an absorber material of which has a second absorption spectrum at least partially separate with respect to the first absorption spectrum, the scattering layer being inserted between the first photovoltaic cell and the second photovoltaic cell.

14. A cover for a radiation-collecting element, the cover comprising a transparent substrate and a scattering layer having a transparent fibrous structure and a transparent medium constructed and arranged to encapsulate fibers of the fibrous structure, an absolute value of a difference between a refractive index of the fibers of the fibrous structure and a refractive index of the encapsulating medium being equal to or greater than 0.05.

15. The device as claimed in claim 7, wherein the fibrous structure has a mass per unit area of between 10 and 100 g/m2.

16. The device as claimed in claim 8, wherein the fibrous structure comprises fibers having a diameter between 5 and 15 micrometers.

17. The cover as claimed in claim 14, wherein the radiation-collecting element is a photovoltaic cell.

* * * * *